(12) United States Patent
Lesher et al.

(10) Patent No.: US 11,486,898 B2
(45) Date of Patent: Nov. 1, 2022

(54) MULTI-CONDUCTOR TRANSMISSION LINE PROBE

(71) Applicant: FormFactor, Inc., Livermore, CA (US)

(72) Inventors: Tim Lesher, Portland, OR (US); Jason William Cosman, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 17/345,613

(22) Filed: Jun. 11, 2021

(65) Prior Publication Data

US 2021/0389348 A1 Dec. 16, 2021

Related U.S. Application Data

(60) Provisional application No. 63/037,935, filed on Jun. 11, 2020.

(51) Int. Cl.
*G01R 1/073* (2006.01)
*G01R 1/067* (2006.01)

(52) U.S. Cl.
CPC ..... *G01R 1/07307* (2013.01); *G01R 1/06755* (2013.01)

(58) Field of Classification Search
CPC ........................ G01R 1/07307; G01R 1/06755
See application file for complete search history.

(56) References Cited

U.S. PATENT DOCUMENTS

| 5,373,231 | A | 12/1994 | Boll | |
|---|---|---|---|---|
| 10,114,054 | B1 | 10/2018 | Gunsay | |
| 2005/0134298 | A1* | 6/2005 | Campbell | G01R 1/06711 324/755.11 |
| 2006/0125465 | A1 | 6/2006 | Xiang | |
| 2021/0003440 | A1 | 1/2021 | Edvardsson | |

* cited by examiner

*Primary Examiner* — Paresh Patel
(74) *Attorney, Agent, or Firm* — Lumen Patent Firm

(57) ABSTRACT

Vertical transmission line probes having alternating capacitive and inductive sections are provided. These alternating sections can be designed to provide a desired transmission line impedance (e.g., between 10 and 100 Ohms, preferably 50 Ohms). Probe flexure in operation is mainly in the inductive sections, advantageously reducing flexure stresses on the dielectrics in the capacitive sections.

10 Claims, 8 Drawing Sheets

MULTI-CONDUCTOR TRANSMISSION LINE PROBE

CROSS REFERENCE TO RELATED APPLICATIONS

This application claims priority from U.S. Provisional Patent Application 63/037,935 filed Jun. 11, 2020, which is incorporated herein by reference.

FIELD OF THE INVENTION

This invention relates to vertical probes for making temporary electrical contact to a device under test.

BACKGROUND

Electrical devices and circuits are commonly tested using probe arrays configured to make temporary electrical contact to the device under test. As technology evolves, there is an increasing demand for probing of high frequency (e.g., 10 GHz or more) devices under test. Currently, high bandwidth probe cards (>10 GHz) either use very short probes, such as a membrane probe card, or a combination of separate signal probes and ground probes.

A membrane probe card has very little flexure since it is very short and stiff. This limits probe overtravel and produces very high contact forces. In cases where the signal probe is a separate structure from the ground probe, signal and ground probes do not flex together as a monolithic unit. As a result of this, there can be undesirable changes in impedance as devices are tested. Also, mechanical constraints from separated signal and ground probes limit how well the impedance can be matched to ideal. Accordingly, it would be an advance in the art to provide improved high frequency probes.

SUMMARY

This work provides vertical transmission line (e.g., ground-signal-ground) probes having alternating capacitive and inductive sections. These alternating sections can be designed to provide a desired transmission line impedance (e.g., between 10 and 100 Ohms, preferably 50 Ohms). Probe flexure in operation is mainly in the inductive sections, advantageously reducing flexure stresses on the dielectrics in the capacitive sections.

The lengths of these sections are preferably significantly smaller than the probe length (for example, less than $\frac{1}{10}^{th}$ the overall length of the probe), such that the resulting alternating capacitive and inductive impedances provide the desired RF transmission line impedance with sufficient accuracy.

This allows for a multiconductor probe where individual conductors are separated by dielectrics to achieve a transmission line effect. The better impedance match improves frequency bandwidth of the overall probe structure. The mixed capacitive and inductive regions improve mechanical integrity of the structure, where the mechanical integrity is predominantly in the capacitive regions of the probe where flexure is low.

DETAILED DESCRIPTION

Figure 1A:
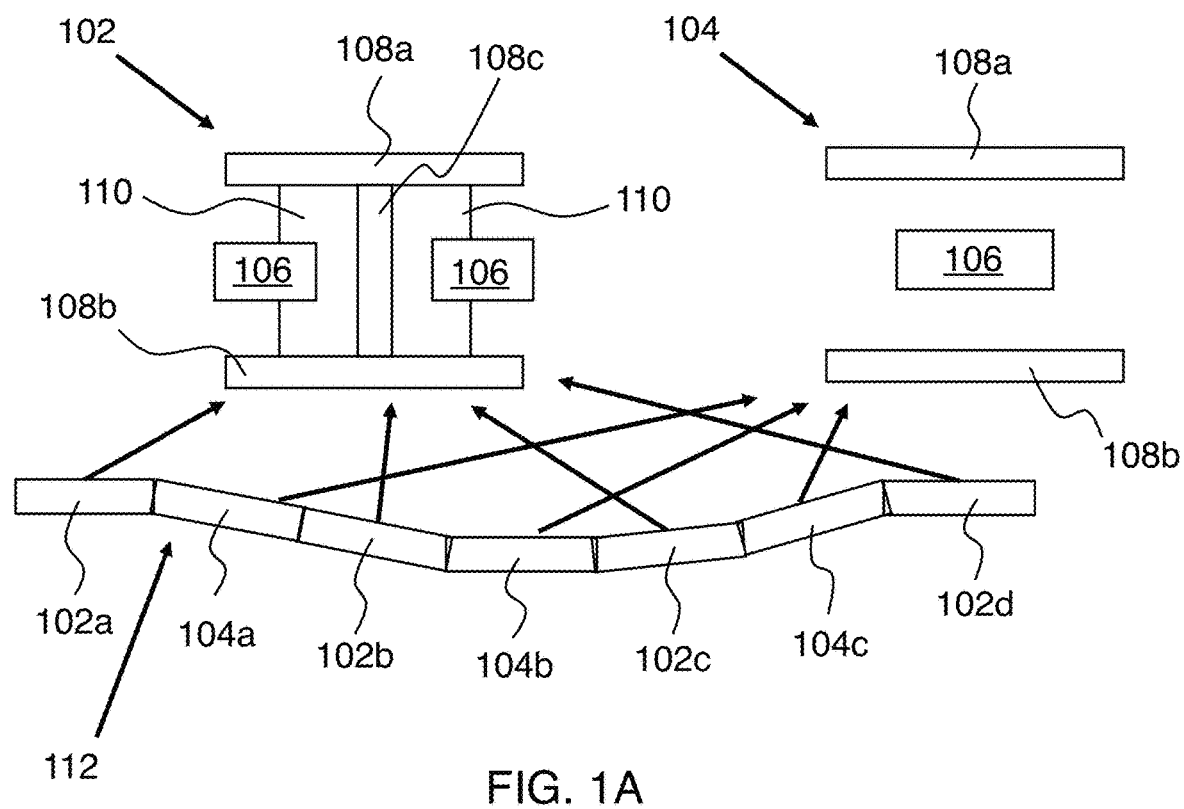
FIG. 1A shows an exemplary embodiment of the invention.

FIG. 1A schematically shows an exemplary embodiment of the invention. This example is a vertical probe 112 for testing electrical devices. It includes an alternating sequence of capacitive sections (102a, 102b, 102c, 102d) and inductive sections (104a, 104b, 104c) along the length of probe 112. Here 102 shows a cross section through any of 102a, 102b, 102c, 102d, and 104 shows a cross section through any of 104a, 104b, 104c. Probe 112 includes a signal conductor 106 and one or more ground conductors (108a, 108b) insulated from the signal conductor.

The capacitive sections (e.g., 102a, 102b, 102c, 102d) include a dielectric material 110 configured to hold the signal conductor 106 at fixed separations from the one or more ground conductors 108a, 108b by occupying space between the signal conductor 106 and the one or more ground conductors 108a, 108b, as shown in cross section view 102. The inductive sections (e.g., 104a, 104b, 104c) are air bridge structures having the signal conductor 106 separated from the one or more ground conductors 108a, 108b by air gaps, as shown in cross section view 104. Here posts 108c connect ground conductors 108a and 108b to each other in the capacitive sections, as described below in more detail in connection with FIG. 2.

Impedances of the capacitive sections and impedances of the inductive sections effectively provide a uniform transmission line impedance of the probe. This is possible according to the known approximate equivalence of a periodic LC structure with a transmission line. So in some embodiments it is preferred that the alternating sequence of capacitive sections and inductive sections be periodic along the length of the probe. Preferably, the uniform transmission line impedance of the probe is substantially 50 Ohms (i.e., 45-55 Ohms). The lengths of these capacitive and inductive sections are preferably significantly smaller than the probe length (for example, less than $\frac{1}{10}$th the overall length of the probe), such that the resulting alternating capacitive and inductive impedances provide the desired RF transmission line impedance with sufficient accuracy.

Figure 1B:
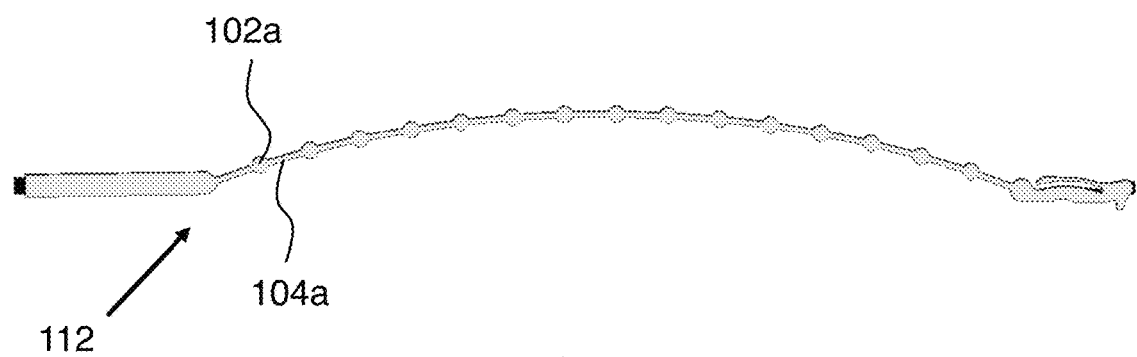
FIG. 1B shows an exemplary overall probe configuration.

FIG. 1B shows an exemplary overall probe configuration. This is a somewhat more realistic view of the overall probe configuration than shown on FIG. 1A.

Figure 2:
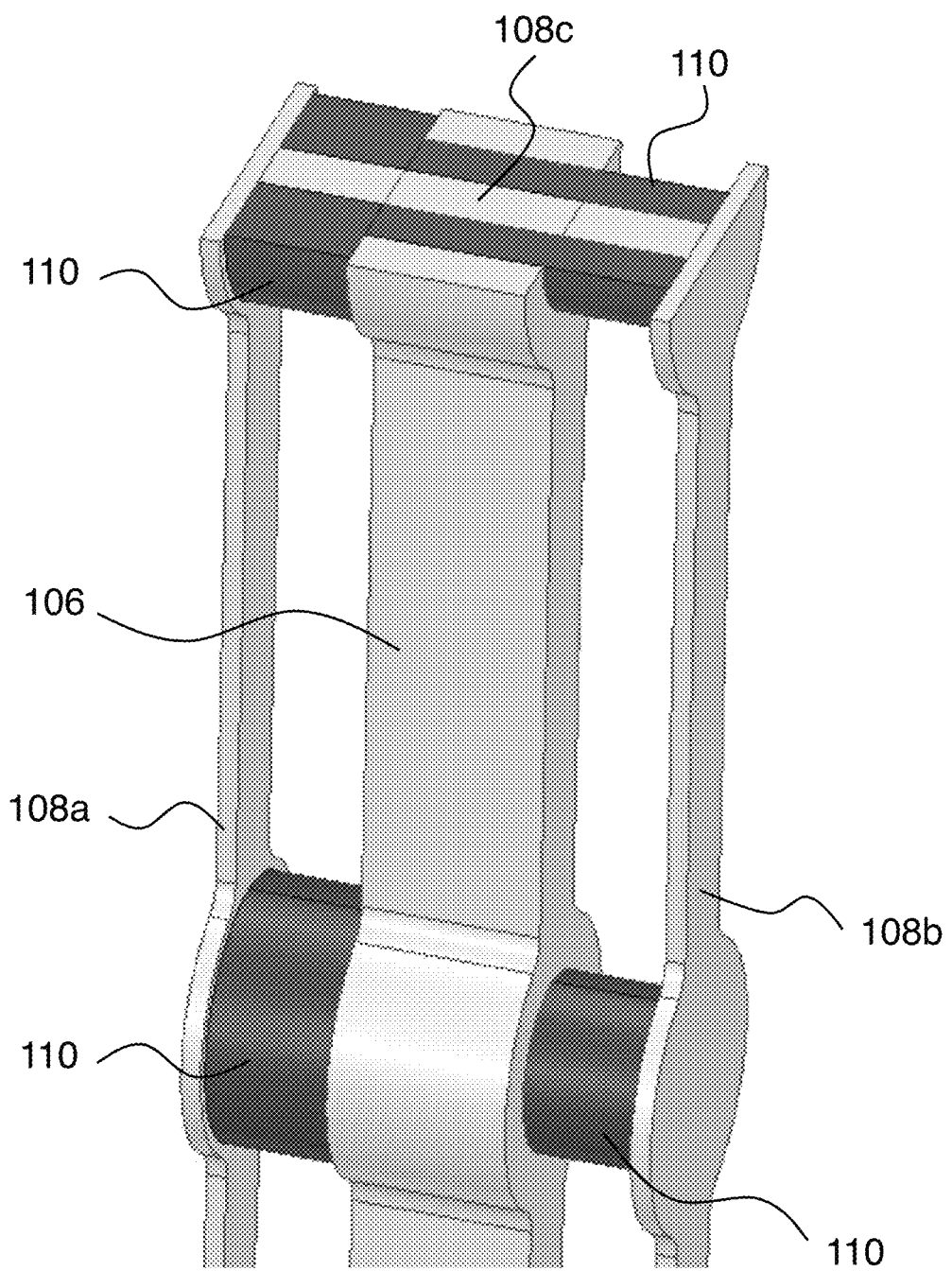
FIG. 2 is a close up view of an exemplary embodiment.

FIG. 2 is a close up view of an exemplary embodiment. This example relates to a preferred embodiment where the vertical probe has a ground-signal-ground configuration. This ground-signal-ground configuration is also shown (more schematically) in views 102 and 104 on FIG. 1A. Preferably, the grounds 108a, 108b of the ground-signal-ground configuration are electrically connected within the vertical probe. A preferred way to provide this connection is shown on FIG. 2. In this example, the capacitive sections are configured as layered posts including:

a conductive core 108c connecting a bottom ground layer 108a to a top ground layer 108b;

an insulating shell 110 disposed around the conductive core 108c; and a signal conductor 106 disposed around the insulating shell 110.

Here the signal conductor 106 is separated from the conductive core 108c by the insulating shell 110. The insulating shell 110 defines a bottom separation between the signal conductor 106 and the bottom ground layer 108a.

The insulating shell 110 also defines a top separation between the signal conductor 106 and the top ground layer 108b. Insulating shell 110 can have different lateral thicknesses in different layers to aid in defining the bottom and/or top separations.

Figure 3A:
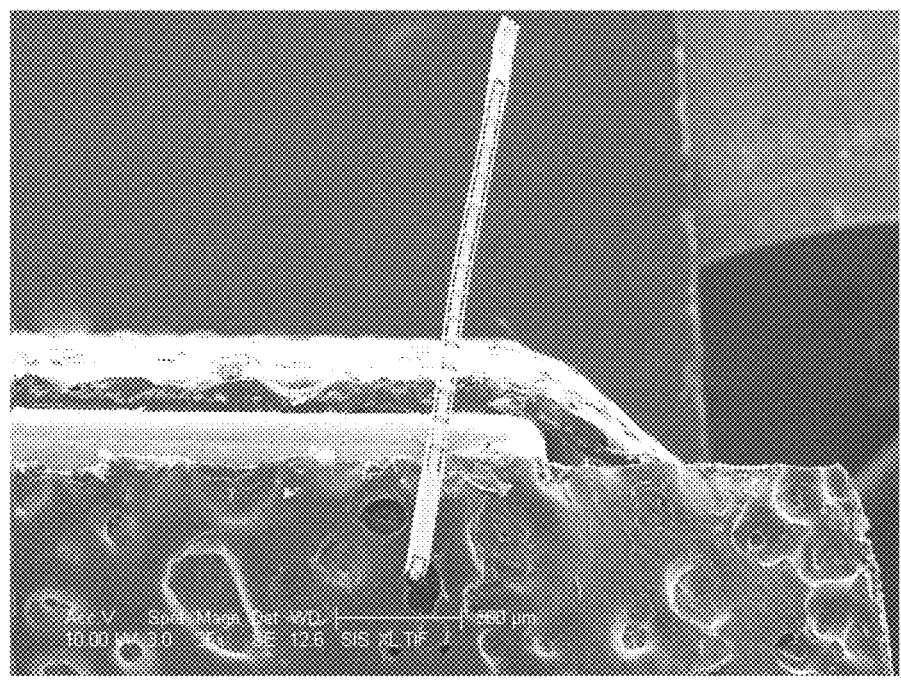
FIGS. 3A-C are images of fabricated probes at various magnifications.
Figure 3B:
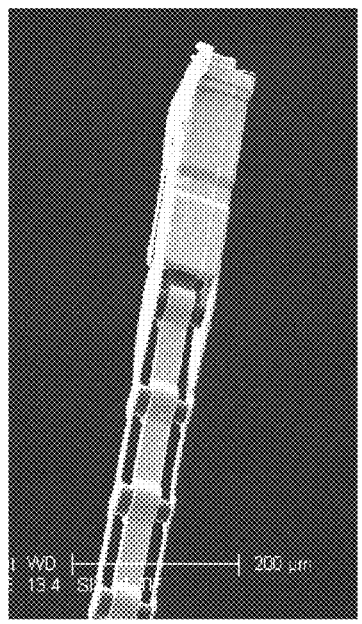
Figure 3C:
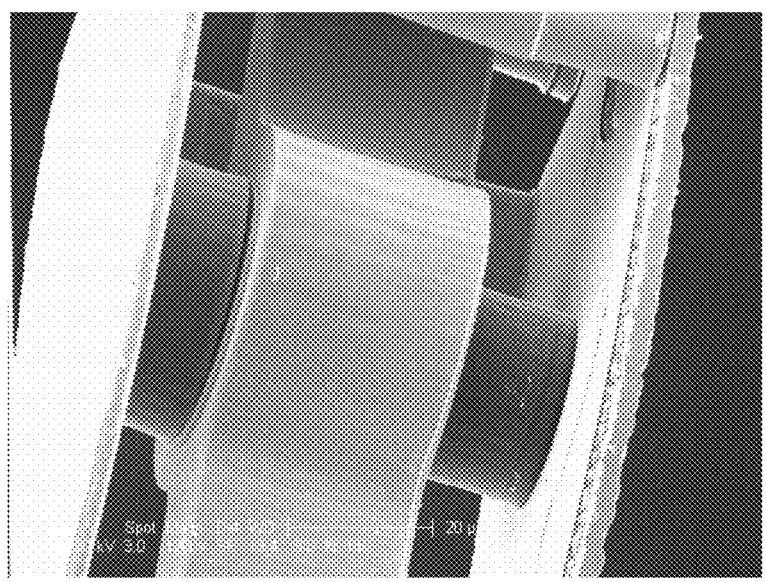

FIGS. 3A-C are images of fabricated probes at various magnifications. Here the inductive and capacitive sections of the probes as described above are clearly visible in the fabricated structures.

Figure 4A:
FIGS. 4A-B show images of a probe at two points in an exemplary fabrication sequence.
Figure 4B:
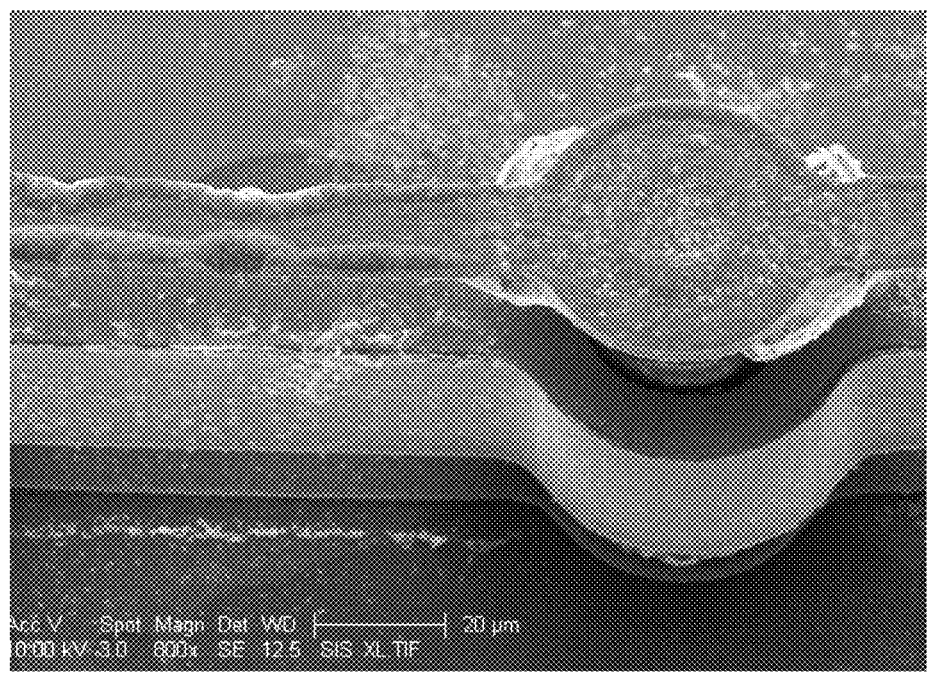

Probes as described above can be fabricated via MEMS (microelectromechanical systems) fabrication technology. Preferably, the insulators as described above are organic dielectric materials which are protected from damage by plasma or chemical processes by metallic encapsulation. The organic dielectrics are revealed at the end of the process by selective etching of the metal protecting the dielectric. For example, Copper and other probe materials can shield the dielectric during fabrication processes that can damage the dielectric, such as plasma processes. FIGS. 4A-B shows scanning electron microscope (SEM) images of the same region during fabrication. The dielectric is on the inside of the metal formations when appropriate. The images show before (FIG. 4A) and after (FIG. 4B) removal of the protective metal, and formation of the resultant air bridges.

Figure 5A:
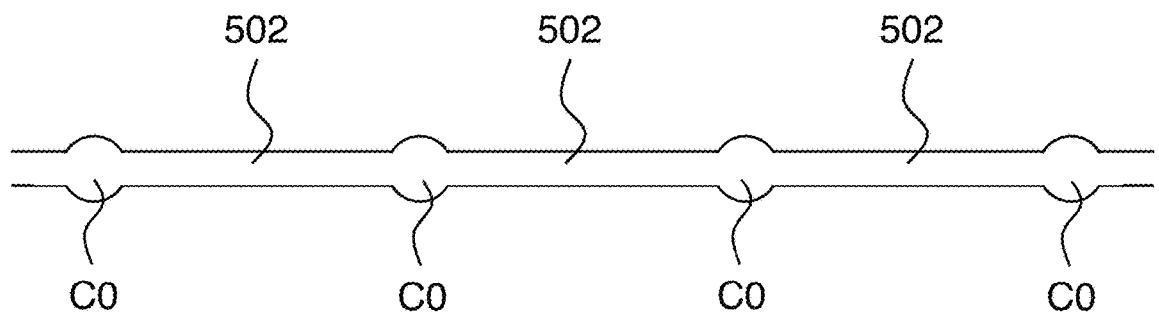
FIGS. 5A-C schematically show exemplary probe design variations.
Figure 5B:
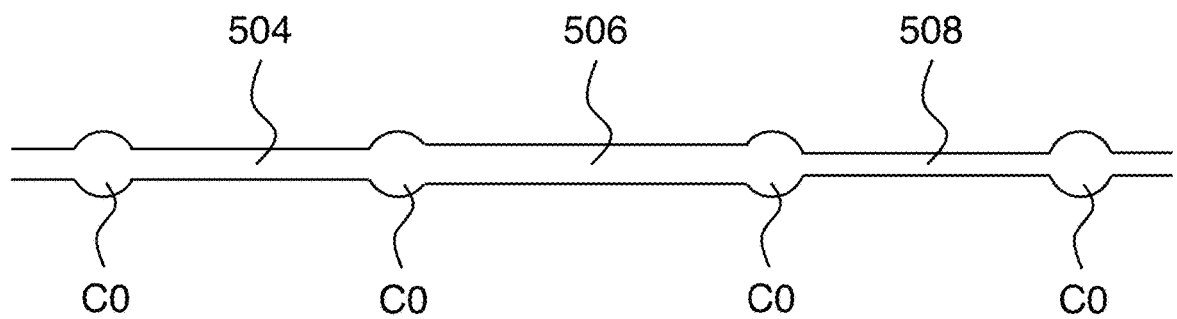
Figure 5C:
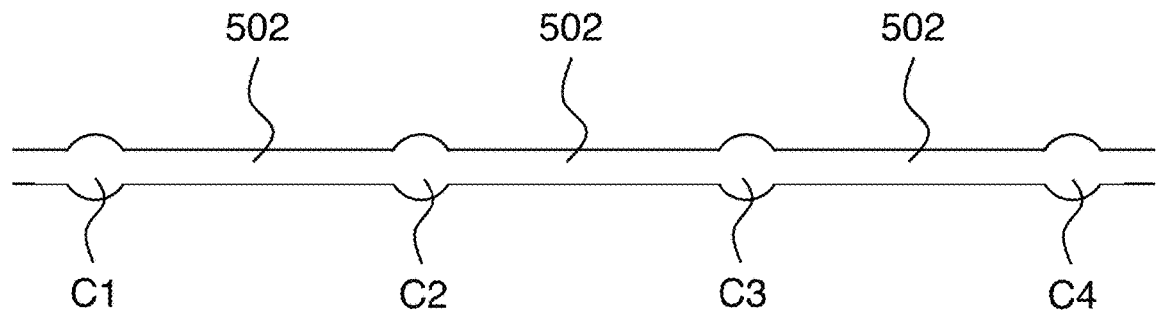

FIGS. 5A-C schematically show exemplary probe design variations. The example of FIG. 5A shows a periodic probe having identical capacitances C0 in the capacitive sections and with each inductive section 502 having the same conductor width. In the example of FIG. 5B, lengths and/or widths of one or more of the inductive sections are modulated along the length of the probe to determine a mechanical resilience of the probe. Here inductive sections 504, 506, 508 have different widths, as shown. In the example of FIG. 5C, capacitances of one or more of the capacitive sections are modulated along the length of the probe. Here different capacitances C1, C2, C3, C4 for the capacitive sections are shown. One way to modulate capacitance this way is to alter the distance between signal conductor 106 and conductive core 108c on FIG. 2 to have a different value in each capacitive section.

Figure 6:
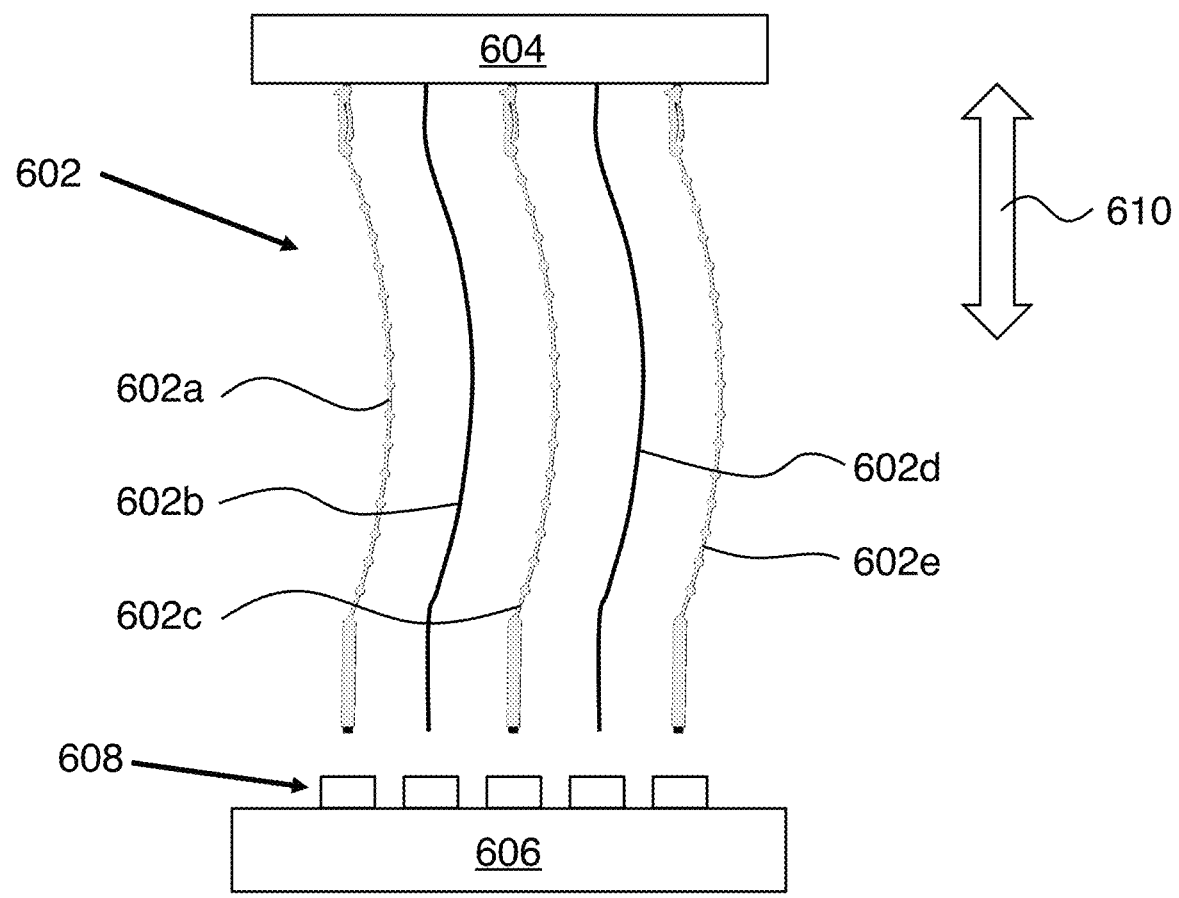
FIG. 6 shows an exemplary probe array according to an embodiment of the invention.

FIG. 6 shows an exemplary probe array according to an embodiment of the invention. Here a probe array 602 includes two or more of the vertical probes as described above (probes 602a, 602c, 602e) and is affixed to a space transformer 604, where the resulting probe head assembly is configured to make temporary electrical contact to contacts 608 on a device under test 606, as schematically indicated by arrow 610. In cases where guide plates are used to define the positions of probes in the probe array, electrical contact between metal (or metallized) guide plates and the ground conductors of ground-signal-ground probes as described above can be used to improve electrical grounding. This is analogous to prior work on multipath probes having outer ground conductors in combination with metal or metalized guide plates. The number and arrangement of the transmission line probes in the array is not critical for practicing the invention. The configuration of the device under test usually dictates the number and arrangement of the probes.

It is often preferred in practice for probe array 602 to further include one or more other vertical probes (602b, 602d) which can have any conventional vertical probe design. These other probes can be used for connections where the improved electrical performance of transmission line probes isn't needed, and cost reduction and/or improving current carrying capacity are more relevant issues. Thus a preferred probe head concept uses transmission line probes only for those electrical connections that require the improved electrical performance as described below. The rest of the connections to the device under test can be made with conventional vertical probes.

Figure 7:
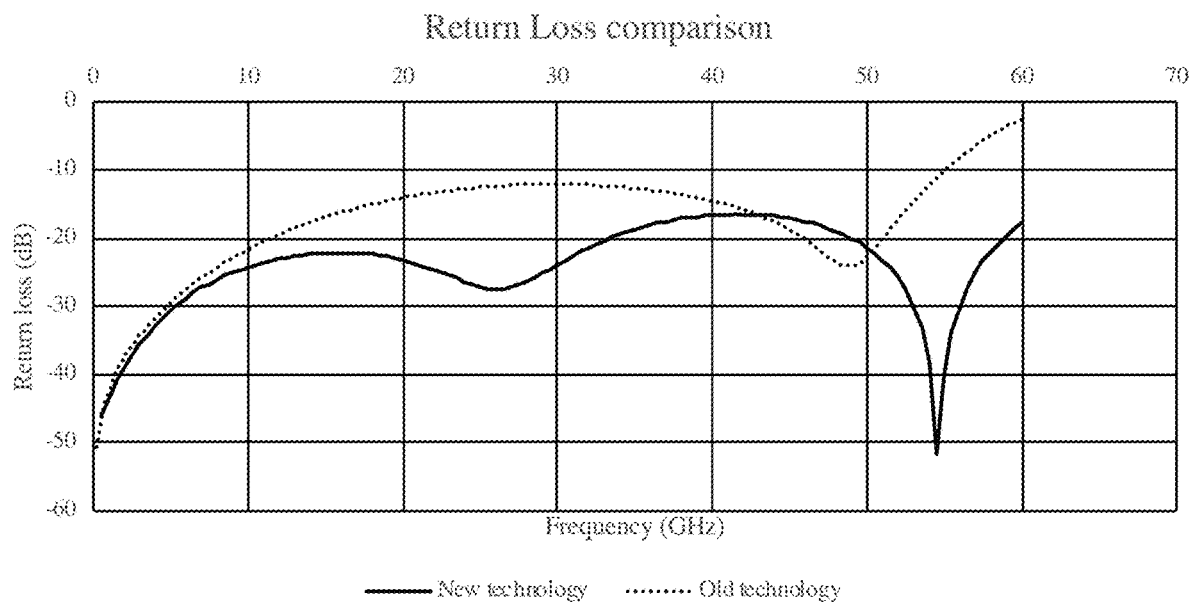
FIG. 7 shows return loss results for conventional and new probes.

The resulting probes have demonstrated good electrical performance. In one example, return loss for transmission line probes was better (i.e., below) −15 dB for frequencies up to 60 GHz, which is markedly better than conventional probe designs which exceeded −15 dB return loss for frequencies over 15 GHz (FIG. 7). Variability of return loss with probe spacing and positions was also less for transmission line probes than for conventional probes.

Figure 8:
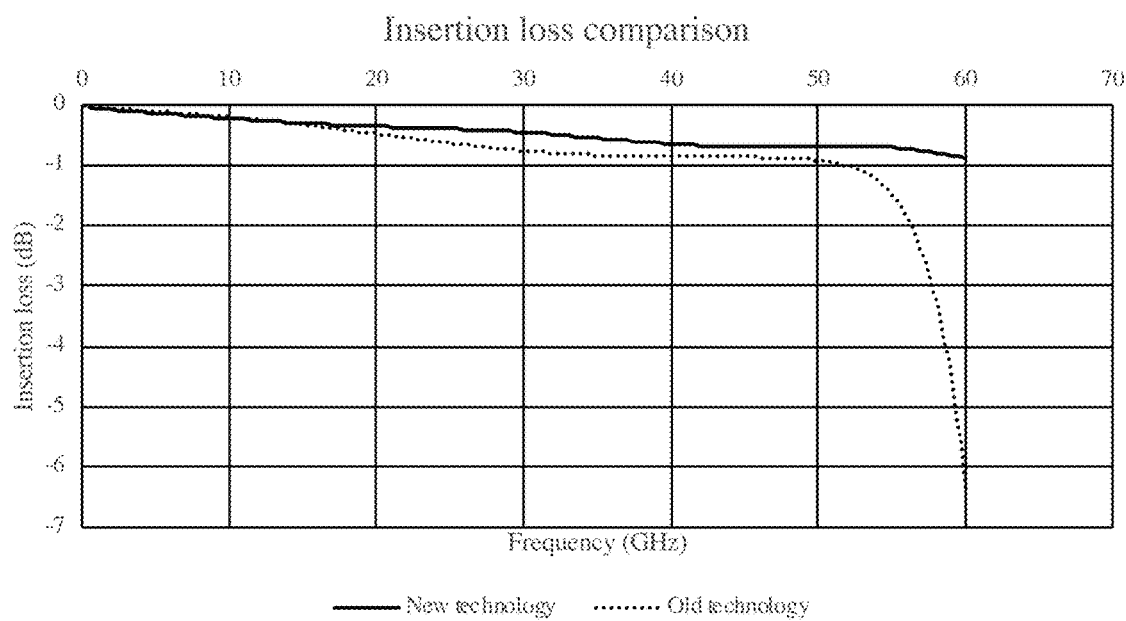
FIG. 8 shows insertion loss results for conventional and new probes.

In another example, insertion loss for transmission line probes was better (i.e., below) 1 dB for frequencies up to 60 GHz, which is markedly better than conventional probe designs which exceeded 6 dB insertion loss for frequencies up to 60 GHz (FIG. 8). Variability of insertion loss with probe spacing and positions was also less for transmission line probes than for conventional probes.

Figure 9:
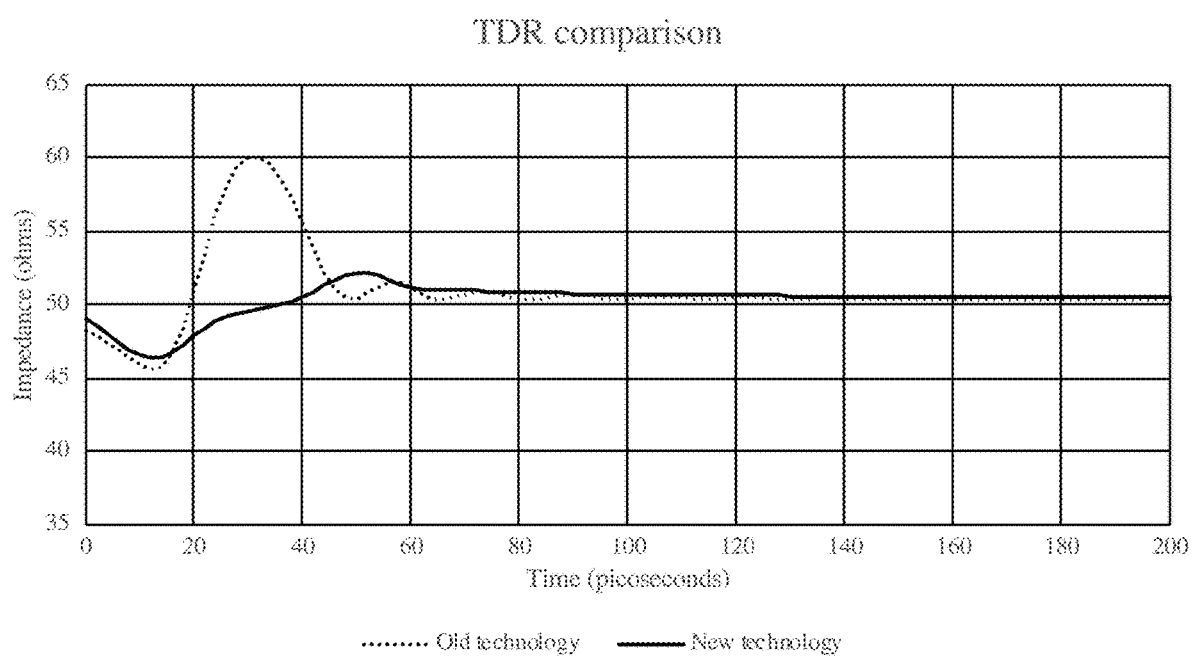
FIG. 9 shows terminal impedance time domain reflectometry (TDR) results for conventional and new probes.

In a final example, impedance time domain reflectometry (TDR) for transmission line probes shows substantially less ringing than for conventional probes. (FIG. 9). Variability of impedance time domain reflectometry with probe spacing and positions was also less for transmission line probes than for conventional probes.

The invention claimed is:

1. A vertical probe for testing electrical devices, the probe comprising:
   an alternating sequence of capacitive sections and inductive sections along a length of the probe;
   wherein the probe includes a signal conductor and one or more ground conductors insulated from the signal conductor;
   wherein the capacitive sections include a dielectric material configured to hold the signal conductor at fixed separations from the one or more ground conductors by occupying space between the signal conductor and the one or more ground conductors;
   wherein the inductive sections are air bridge structures having the signal conductor separated from the one or more ground conductors by air gaps;
   wherein impedances of the capacitive sections and impedances of the inductive sections effectively provide a uniform transmission line impedance of the probe.

2. The vertical probe of claim 1, wherein the alternating sequence of capacitive sections and inductive sections is periodic along the length of the probe.

3. The vertical probe of claim 1, wherein the uniform transmission line impedance of the probe is substantially 50 Ohms.

4. The vertical probe of claim 1, wherein the vertical probe has a ground-signal-ground configuration.

5. The vertical probe of claim 4, wherein the grounds of the ground-signal-ground configuration are electrically connected within the vertical probe.

6. The vertical probe of claim 1, wherein the capacitive sections are configured as layered posts including:
- a conductive core connecting a top ground layer to a bottom ground layer;
- an insulating shell disposed around the conductive core;
- a signal conductor disposed around the insulating shell;
- wherein the signal conductor is separated from the conductive core by the insulating shell;
- wherein the insulating shell defines a top separation between the signal conductor and the top ground layer;
- wherein the insulating shell defines a bottom separation between the signal conductor and the bottom ground layer.

7. The vertical probe of claim 1, wherein lengths and/or widths of one or more of the inductive sections are modulated along the length of the probe to determine a mechanical resilience of the probe.

8. The vertical probe of claim 1, wherein capacitances of one or more of the capacitive sections are modulated along the length of the probe.

9. A probe head comprising a probe array including two or more of the vertical probes of claim 1.

10. The probe head of claim 9, wherein the probe array further comprises one or more vertical probes.

* * * * *